United States Patent [19]

Ogita

[11] 4,404,430
[45] Sep. 13, 1983

[54] FM STEREO DEMODULATION CIRCUIT WITH VOLTAGE DIVIDING AND MULTIPLEXING TECHNIQUES

[75] Inventor: Minoru Ogita, Hamamatsu, Japan

[73] Assignee: Nippon Gakki Seizo Kabushiki Kaisha, Hamamatsu, Japan

[21] Appl. No.: 323,374

[22] Filed: Nov. 20, 1981

[30] Foreign Application Priority Data

Nov. 28, 1980 [JP] Japan ................................. 55-167744

[51] Int. Cl.³ ........................ H04H 5/00; H03B 19/00
[52] U.S. Cl. .............................. 179/1 GE; 179/1 GD; 328/14; 329/124
[58] Field of Search ............. 179/1 GB, 1 GC, 1 GD, 179/1 GN, 1 GM, 1 P, 1 GE; 363/43, 148, 156; 328/14, 162, 165; 329/122, 123, 124

[56] References Cited

U.S. PATENT DOCUMENTS

| | | | |
|---|---|---|---|
| 1,691,986 | 11/1928 | Nyquist ................................. | 363/43 |
| 3,649,922 | 3/1972 | Ralph ............................... | 328/165 X |
| 3,949,206 | 4/1976 | Edwards et al. ............ | 179/1 P UX |
| 4,225,914 | 9/1980 | Hirata et al. ....................... | 363/43 X |
| 4,264,784 | 4/1981 | Lorea ................ | 179/1 GE |
| 4,366,470 | 12/1982 | Takanashi et al. ................ | 328/14 X |

Primary Examiner—R. J. Hickey
Attorney, Agent, or Firm—Oblon, Fisher, Spivak, McClelland & Maier

[57] ABSTRACT

An FM stereo demodulation circuit comprises a resistor voltage dividing network having a plurality of outputs; a first switch circuit having a plurality of analog switches which respectively couple the outputs of the voltage dividing network to a first output terminal; a second switch circuit having a plurality of analog switches which respectively couple the outputs of the voltage dividing network to a second output terminal; and a switch control circuit which sequentially enables the analog switches of the first and second switch circuits over one cycle period of a subcarrier signal in response to a pilot signal in an FM stereo composite signal. The circuits produce a staircase-wave multiplying signal having a waveshape which depends on the setting of the resistance values of resistors of the voltage dividing network. The FM stereo composite signal having the pilot signal therein or the pilot signal removed therefrom prior to demodulation is applied to the voltage dividing network so that the FM stereo composite signal is multiplied by the multiplying signal to accomplish the FM stereo demodulation.

5 Claims, 11 Drawing Figures

FM STEREO DEMODULATION CIRCUIT WITH VOLTAGE DIVIDING AND MULTIPLEXING TECHNIQUES

BACKGROUND OF THE INVENTION

The present invention relates to an FM stereo demodulation circuit.

Figure 1:
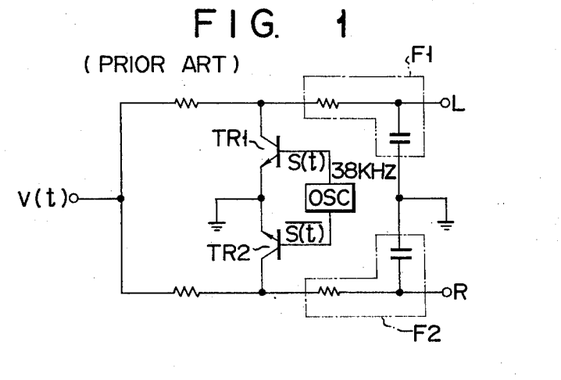
FIG. 1 is a schematic circuit diagram of a prior art switching type FM demodulation circuit.

An analog multiplication of a composite signal and a sinusoidal signal having a subcarrier frequency of 38 kHz is generally preferred for FM stereo demodulation. However, it is difficult to obtain an ideally linear analog multiplier. For this reason, in general, a switching system as shown in FIG. 1 utilizing a rectangular switching waveform is used. Referring to FIG. 1, a composite signal v(t) is supplied to switching elements TR1 and TR2. The switching elements TR1 and TR2 are alternately turned on by a 38 kHz switching signals $\overline{S(t)}$ and S(t) from an oscillation circuit OSC (usually a phase-locked loop circuit is used) which are synchronized with a pilot signal of 19 kHz in the composite signal. The switching signals S(t) and $\overline{S(t)}$ are opposite in phase to each other. The composite signal v(t) is multiplied by the switching signal of 38 kHz. Left and right audio signals are taken from low-pass filters F1 and F2, respectively.

Figure 2:
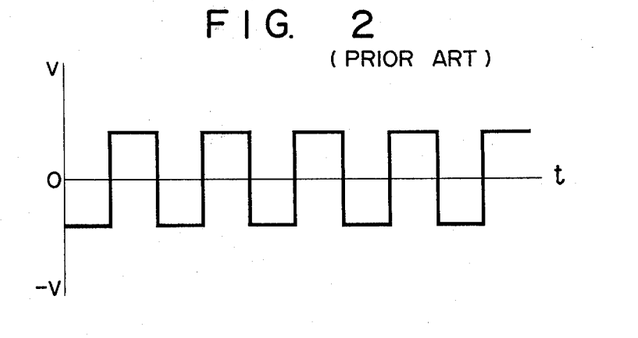
FIG. 2 shows a waveform of a switching signal used in the demodulation circuit of FIG. 1.

A rectangular wave having a duty ratio of 50% as shown in FIG. 2 is generally used as the switching signal S(t). In this case, a demodulation output is given by $$v(t) \cdot S(t) = v(t) \times \left( \frac{1}{2} \pm \frac{2}{\pi} \cos\omega t \pm \frac{2}{3\pi} \cos 3\omega t \ldots \pm \frac{2}{5\omega} \cos 5\omega t \pm \ldots \right).$$

Figure 3:
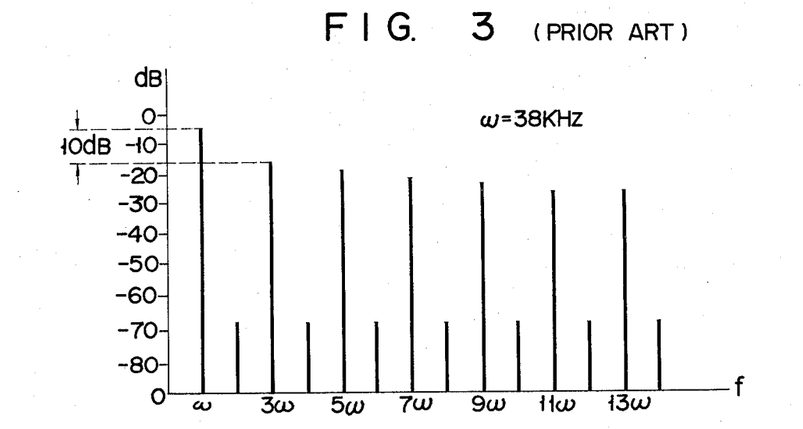
FIG. 3 shows demodulation sensitivity characteristics of the demodulation circuit of FIG. 1.

As is apparent from the above equation, when the composite signal v(t) includes noise components of frequencies 3ω, 5ω and so on, the demodulation circuit has demodulation sensitivity for frequency components of 3ω, 5ω, etc. In this manner, when the rectangular waveform having duty ratio of 50% is used, the demodulation circuit has great demodulation sensitivity for input signals of 114 kHz (38 kHz×3), 190 kHz (38 kHz×5) or the like, as shown in FIG. 3. The demodulation sensitivity for the 3ω component is only 10 dB lower than the demodulation sensitivity for the ω component. For this reason, when the 3ω and 5ω frequency noise components are included in an output signal of an FM detector, S/N ratio of the output signal of the FM stereo demodulation circuit decreases and beat interference occurs. In order to solve these problems, a filter may occasionally be provided before the demodulation circuit to eliminate the 3ω, 5ω ... frequency components. With this approach, however, it is difficult to ensure the flatness of the amplitude and phase characteristics of the composite signal which has a frequency range of 0 to 53 kHz, thus degrading the frequency characteristic of stereo separation.

SUMMARY OF THE INVENTION

It is an object of the present invention to provide an improved FM stereo demodulation circuit which multiplies a composite signal with a switching signal without using nonlinear active elements.

It is another object of the present invention to provide an FM stereo demodulation circuit whose demodulation sensitivity for harmonic components of a subcarrier is lowered.

It is still another object of the present invention to provide an improved FM stereo demodulation circuit whose stereo separation characteristic is independent of frequencies.

An FM stereo demodulation circuit of this invention comprises a voltage dividing network which is connected to receive an FM stereo composite signal which includes a pilot signal of half the frequency of a subcarrier, or a composite signal from which the pilot signal is removed before demodulation. The voltage dividing network has a plurality of outputs which provide different voltage levels. There are provided a first switch circuit having a plurality of analog switches which, when enabled, respectively couple the outputs of the voltage dividing network to a first output terminal, and a second switch circuit having a plurality of analog switches which, when enabled, respectively couple the outputs of the voltage dividing network to a second output terminal. Further, an analog switch control circuit is provided which is responsive to the pilot signal in the composite signal to scan the analog switches of the first and second switch circuits such that the analog switches of each of the first and second switch circuits are sequentially enabled in a reciprocating manner over one cycle period of the subcarrier, and the switch scan cycle of the first switch circuit is 180 degree out of phase with that of the second switch circuit.

The FM stereo demodulation circuit according to the present invention has a function for producing a multiplication signal which has the same frequency as the scanning frequency of the analog switches, and a function for multiplying an input signal of the voltage dividing circuit network by the multiplication signal, thus accomplishing the FM stereo demodulation operation.

The voltage dividing network may be constituted by resistors, and a staircase waveform of the multiplication signal is determined by values of the resistors. Where the envelope of the multiplication signal is close to a sinusoidal waveform, then an ideal FM stereo demodulation will be achieved. As a result, the demodulation sensitivity for the harmonic components of the subcarrier which may be contained in the composite signal is extremely reduced.

DETAILED DESCRIPTION OF THE PREFERRED EMBODIMENTS

Figure 4:
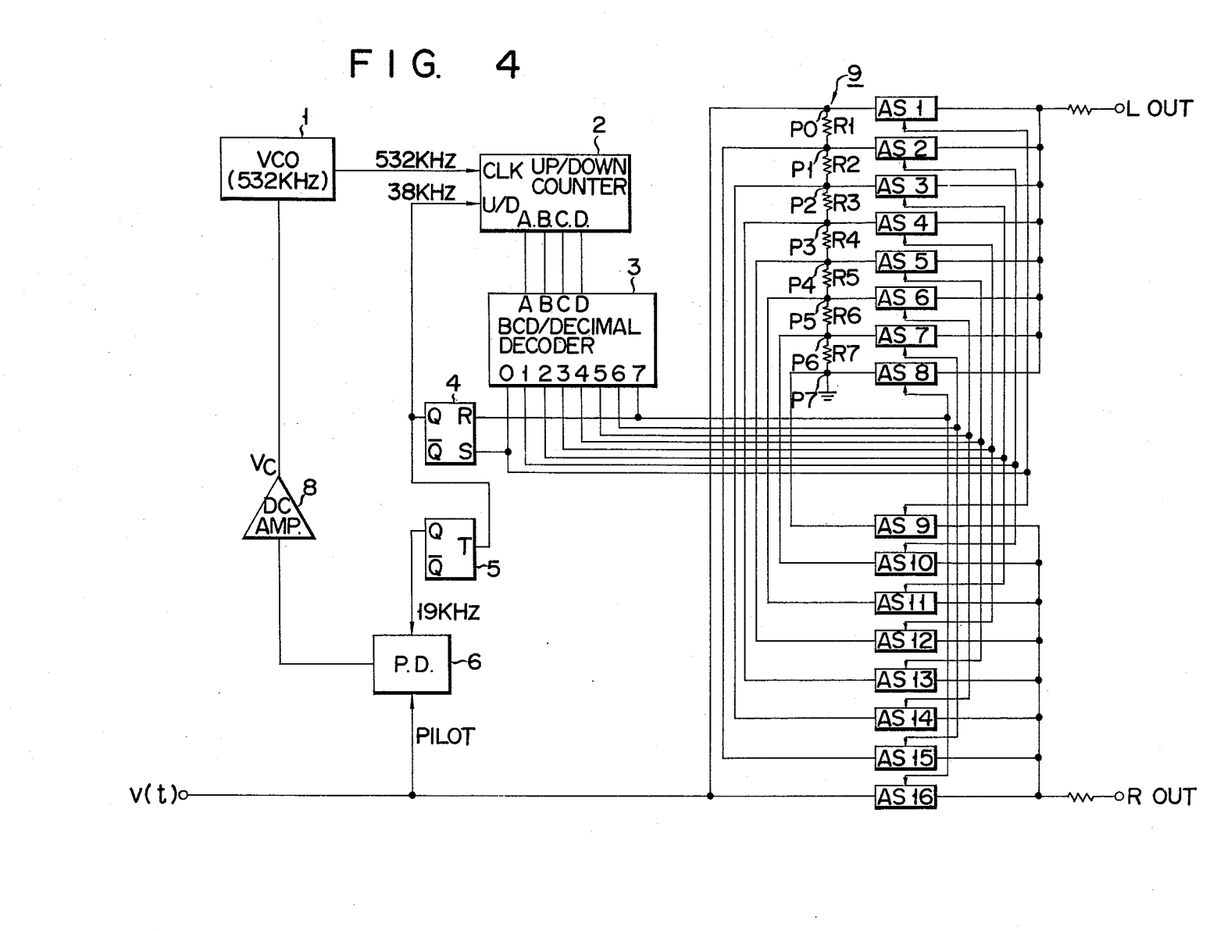
FIG. 4 is a circuit diagram of an FM stereo demodulation circuit according to the present invention.

Referring to FIG. 4, there is shown an FM stereo demodulation circuit of the present invention which comprises a voltage-controlled oscillator (VCO) 1 which produces a rectangular waveform signal having a frequency of 532 kHz, which is fourteen times the subcarrier frequency of 38 kHz. An up-down counter 2 counts the rectangular waveform signals of 532 kHz, and the counting value is converted to a binary-coded decimal (BCD) code. The BCD code output of up-down counter 2 is supplied to a BCD/decimal decoder 3 having outputs "0" to "7" and is decoded into one of decimal numbers "0" to "7".

An RS flip-flop 4 has its set and reset inputs connected to outputs "0" and "7" of BCD/decimal decoder 3, respectively, and its set output Q coupled to an up-down control input U/D of up-down counter 2. It is understood, therefore, that the counting direction of up-down counter 2 is switched every time 7 rectangular output pulses of VCO 1 are counted. The output "0" of BCD/decimal decoder 3 is raised at intervals of 1/38 msec. The output frequency of RS flip-flop 4 is 38 kHz, the subcarrier frequency.

The output Q of RS flip-flop 4 is coupled to a T flip-flop 5 so that a rectangular output signal of 19 kHz is obtained. The rectangular output signal of 19 kHz is applied to a phase comparator 6 to be compared in phase with the pilot signal of 19 kHz in the composite signal v(t). An output voltage (error voltage) of phase comparator 6 is amplified by a DC amplifier 8 and then supplied to VCO 1, so that the output frequency of VCO 1 is locked to 532 kHz. Therefore, the switching of counting direction of up-down counter 2 is performed in synchronism with the pilot signal in the composite signal V(t).

The composite signal V(t) is applied to a resistor series circuit, that is, a voltage dividing circuit 9 consisting of resistors R1 to R7. From each node Pn (n=0, 1, 2, ..., 7) of voltage dividing circuit 9 there is derived a voltage represented by $$V(t) \times \frac{\sum_{n+1}^{7} Rk}{\sum_{k=1}^{7} Rk}$$

Voltages at nodes P0 to P7 are respectively coupled to a left channel output terminal Lout through first analog switches AS1 to AS8 such as transmission gates comprised of CMOS transistors, and to a right channel output terminal Rout through second analog switches AS16 to AS9. An analog switch ASn+1 (n=0, 1, 2, ..., 7) out of first analog switches AS1 to AS8 and an analog switch ASn+9 out of second analog switches AS9 to AS16, which are respectively connected to two nodes (Pn, P7−n) which are symmetrically positioned with respect to resistor R4 located at the center of voltage dividing network 9, are simultaneously turned on/-off by BCD/decimal decoder 3. To this end, control inputs of a pair of analog switches ASn+1 and ASn+9 are commonly connected to an output "n" (n=0, 1, 2, 3, ..., 7) of BCD/decimal decoder 3. That is, the first and second analog switches are sequentially scanned by outputs of BCD/decimal decoder 3 in a reciprocating manner and the scanning cycle of the first analog switches is opposite in phase to that of the second analog switches. With the above arrangement, output voltages at a respective pair of symmetrically positioned nodes (P0, P7), (P1, P6), ... of voltage dividing network 9 are respectively coupled to the left channel output Lout and the right channel output Rout sequentially during intervals of one cycle period of clock pulses of 532 kHz.

Figure 5:
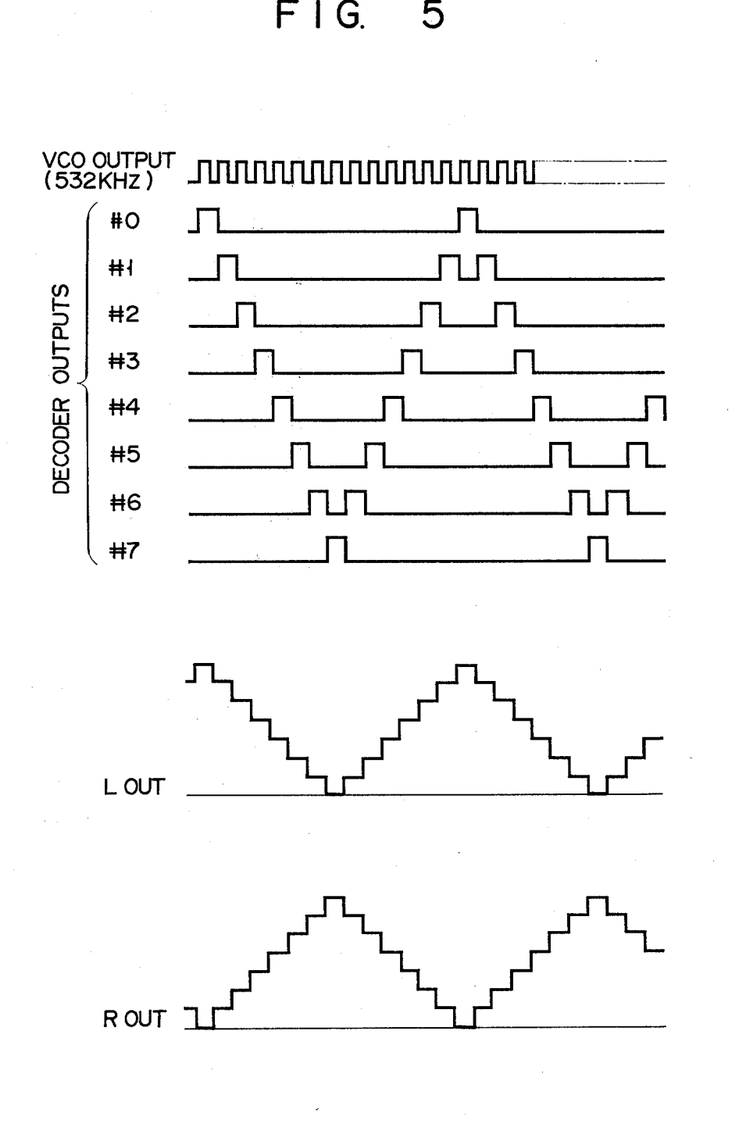
FIG. 5 shows waveforms for explaining the operation of the FM stereo demodulation circuit of FIG. 4.

For example, where resistors R1 to R7 have an equal resistance value and the input signal V(t) is a certain DC voltage, then there will be derived from the left and right outputs Lout and Rout staircase waveform signals having, as a fundamental frequency, the subcarrier frequency of 38 kHz and having a phase difference of 180° therebetween, as shown in FIG. 5. If the staircase waveform signals of FIG. 5 are defined as S(t) and S(t)∠π, when the composite signal V(t) is applied the product V(t)·S(t) is taken from the left channel output Lout and the product V(t)·S(t)∠π is taken from the right channel output Rout. This indicates that the FM stereo demodulation operation is properly performed. The waveform of the multiplication signal S(t) depends on the values of resistors R1 to R7.

Figure 6:
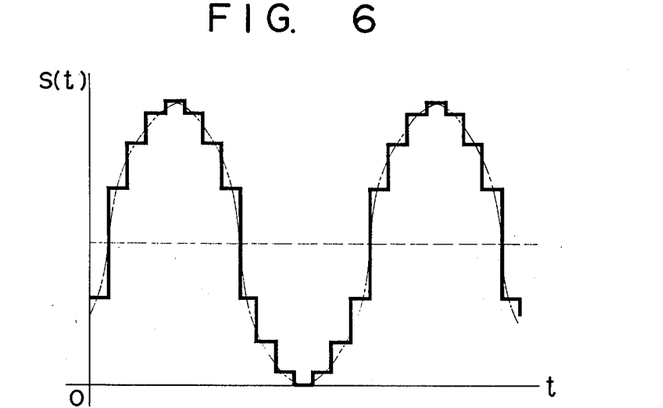
FIG. 6 shows a sinusoidal-wave like staircase waveform signal by which an FM stereo composite signal is multiplied.

Table 1 shows such values of resistors R1 to R7 as the multiplication signals S(t) and S(t)∠π have a sine-wavelike envelope as shown in FIG. 6.

TABLE 1

| Resistor | R1 | R2 | R3 | R4 | R5 | R6 | R7 |
|---|---|---|---|---|---|---|---|
| Value (ohms) | 1k | 2k | 3k | 4k | 3k | 2k | 1k |

Figure 7:
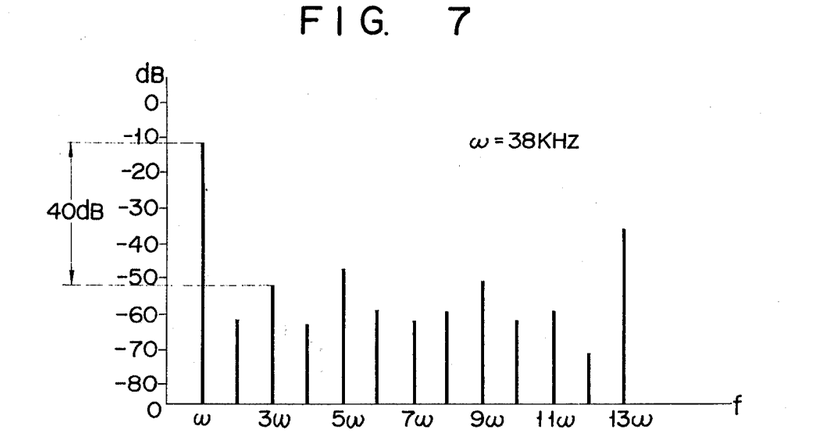
FIG. 7 shows demodulation sensitivity characteristics when the staircase waveform signal of FIG. 6 is used as the multiplication signal.

FIG. 7 shows demodulation sensitivity characteristic of the stereo demodulation circuit when the multiplication signal S(t) has such a sine-wavelike envelope as shown in FIG. 6. It will be understood that, in the stereo demodulation circuit of the present invention, the demodulation sensitivity for the third harmonic component (3ω) becomes about 40 dB lower than for the fundamental frequency component (ω) and, the demodulation sensitivity for the fifth and seventh harmonic components is extremely reduced as compared with that of the conventional demodulation circuit.

Table 2 shows an example of such values of resistors R1 to R7 as the multiplication signals S(t) and S(t)∠π have a triangle-wavelike envelope.

TABLE 2

| Resistor | R1 | R2 | R3 | R4 | R5 | R6 | R7 |
|---|---|---|---|---|---|---|---|
| Resistance | 1k | 1k | 1k | 1k | 1k | 1k | 1k |

Figure 8:
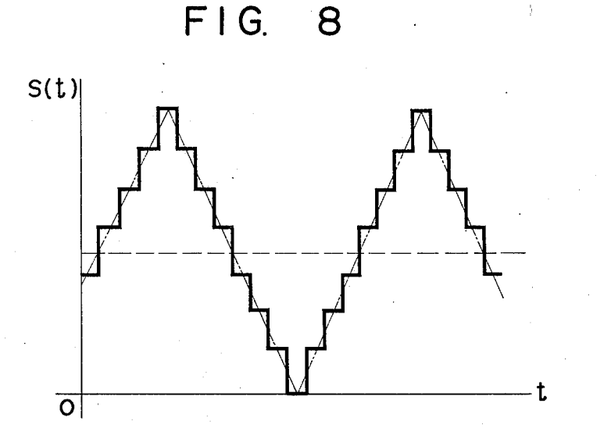
FIG. 8 shows a triangular-wave like multiplication signal.
Figure 9:
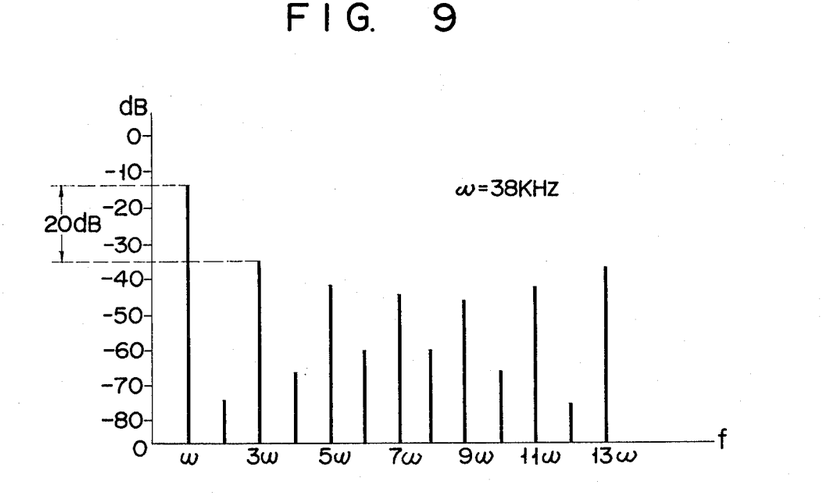
FIG. 9 shows demodulation sensitivity characteristics when the multiplication signal of FIG. 8 is used.

As apparent from Table 2, when resistors R1 to R7 have an equal value, the multiplication signal S(t) has a triangle-wavelike envelope as shown in FIG. 8. FIG. 9 shows the demodulation sensitivity characteristic of the stereo demodulation circuit when the multiplication signals S(t) and S(t)∠π have a waveshape as shown in FIG. 8. It is understood that the demodulation sensitivity for the third harmonic component is about 20 dB lower than for the fundamental frequency component.

As described above, according to the FM stereo demodulation circuit of the present invention, since a nonlinear active element is not used as analog multiplying means the composite signal V(t) can be multiplied by a multiplication signal S(t) having a desired waveshape without distortion. Therefore, where the number of resistors of the voltage dividing network are increased so that the multiplication signal S(t) may become very close to a sine wave, then an ideal stereo demodulation will be accomplished. Further, according to the FM stereo demodulation circuit of the present invention, since the demodulation sensitivity for the third and fifth harmonic components can be extremely reduced, a filter for eliminating the harmonic components need not be provided at the input side of the FM stereo demodulation circuit. Therefore, the problem of frequency dependency of stereo separation is solved.

Figure 10:
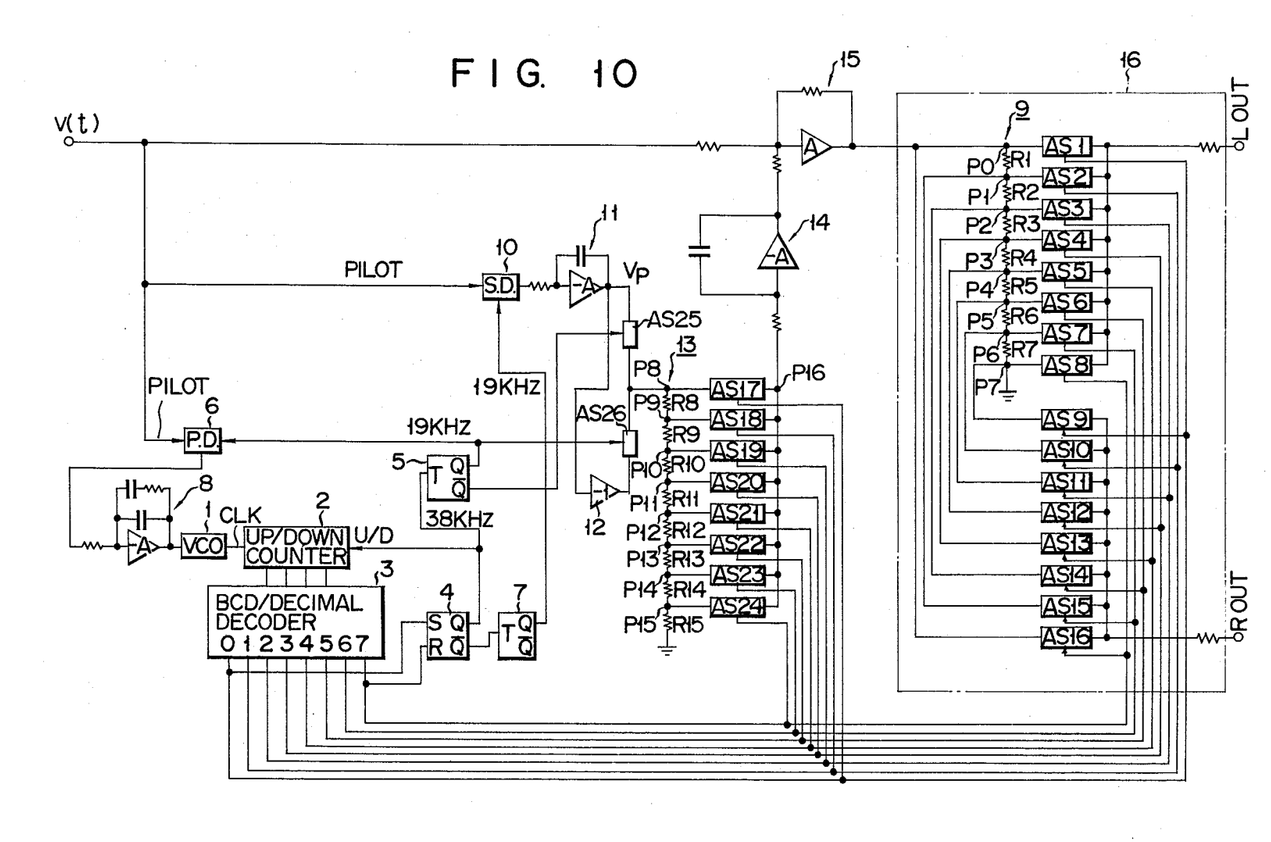
FIGS. 10 and 11 show other embodiments of the FM stereo demodulation circuit according to the present invention.

FIG. 10 shows another embodiment of the FM stereo demodulation circuit of the present invention. The same reference numerals are used in FIG. 10 to denote the same parts as those in FIG. 4, and the description thereof will be excluded. In this embodiment, a pilot signal cancelling signal as well as multiplication signals for stereo demodulation are formed by voltage dividing and multiplexing techniques and analog switches for forming the pilot signal cancelling signal and for the stereo demodulation are controlled by a common digital circuit.

In FIG. 10, a rectangular wave signal of 19 kHz which is synchronized with the pilot signal is produced by a T flip-flop 7 having its trigger input connected to the output $\overline{Q}$ of flip-flop 4. The rectangular wave signal of 19 kHz is applied to a synchronous detector 10 to detect the pilot signal in the composite signal V(t). A detect output signal of synchronous detector 10 is converted to a DC voltage Vp whose magnitude is proportional to amplitude of the pilot signal, by a low-pass filter 11. The DC voltage Vp is coupled to one end of a resistor voltage dividing circuit 13 the other end of which is grounded through an analog switch AS25 and through an inverter 12 and an analog switch AS26.

The resistor voltage dividing circuit 13 includes eight resistors R8 to R15 which are connected in series and from each node Pm (m=8, 9, ..., 15) of voltage dividing circuit 13, is taken a voltage which is given by $$Vp \times \frac{\sum_{k=m}^{15} Rk}{\sum_{k=8}^{15} Rk}$$

The respective nodes P8 to P15 are commonly connected to an output P16 through analog switches AS17 to AS24 and further connected to an adder 15 through a low-pass filter 14.

The analog switches AS25 and AS26 are alternately enabled in response to the outputs $\overline{Q}$ and Q of T flip-flop 5. The analog switches AS17 to AS24 are respectively enabled by the outputs "0" to "7" of BCD/decimal decoder 3. In this embodiment, the values of resistors R8 to R15 are selected such that voltages at respective nodes have levels of equally divided eight samples of the half cycle of a sinusoidal wave. Table 3 shows one example of the values of resistors R8 to R15.

TABLE 3

| Resistor | R8 | R9 | R10 | R11 | R12 | R13 | R14 | R15 |
|---|---|---|---|---|---|---|---|---|
| Value | 1k | 2k | 3k | 4k | 3k | 2k | 1k | Not defined |

With the above arrangement, the rectangular wave signal of 19 kHz which is switched between +Vp and −Vp is applied to resistor voltage dividing circuit 13 and this signal is multiplied by a staircase multiplication signal of 38 kHz whose level is positive. Therefore, a staircase wave signal of 19 kHz having a sine-wavelike envelope is taken from the common connection point P16 of analog switches AS17 to AS24 in synchronism with the pilot signal. The staircase wave signal is smoothed by low-pass filter 14 so that a sinusoidal signal which is 180° out of phase with the pilot signal in the composite signal and has substantially the same amplitude as the pilot signal is formed. This sinusoidal signal is added to the composite signal V(t) in the adder 15 so that the pilot signal is cancelled out. The output signal of adder 15 is applied to demodulation circuit 16 and right and left audio signals are demodulated from the composite signal V(t) in the same manner as in the embodiment described above.

Figure 11:
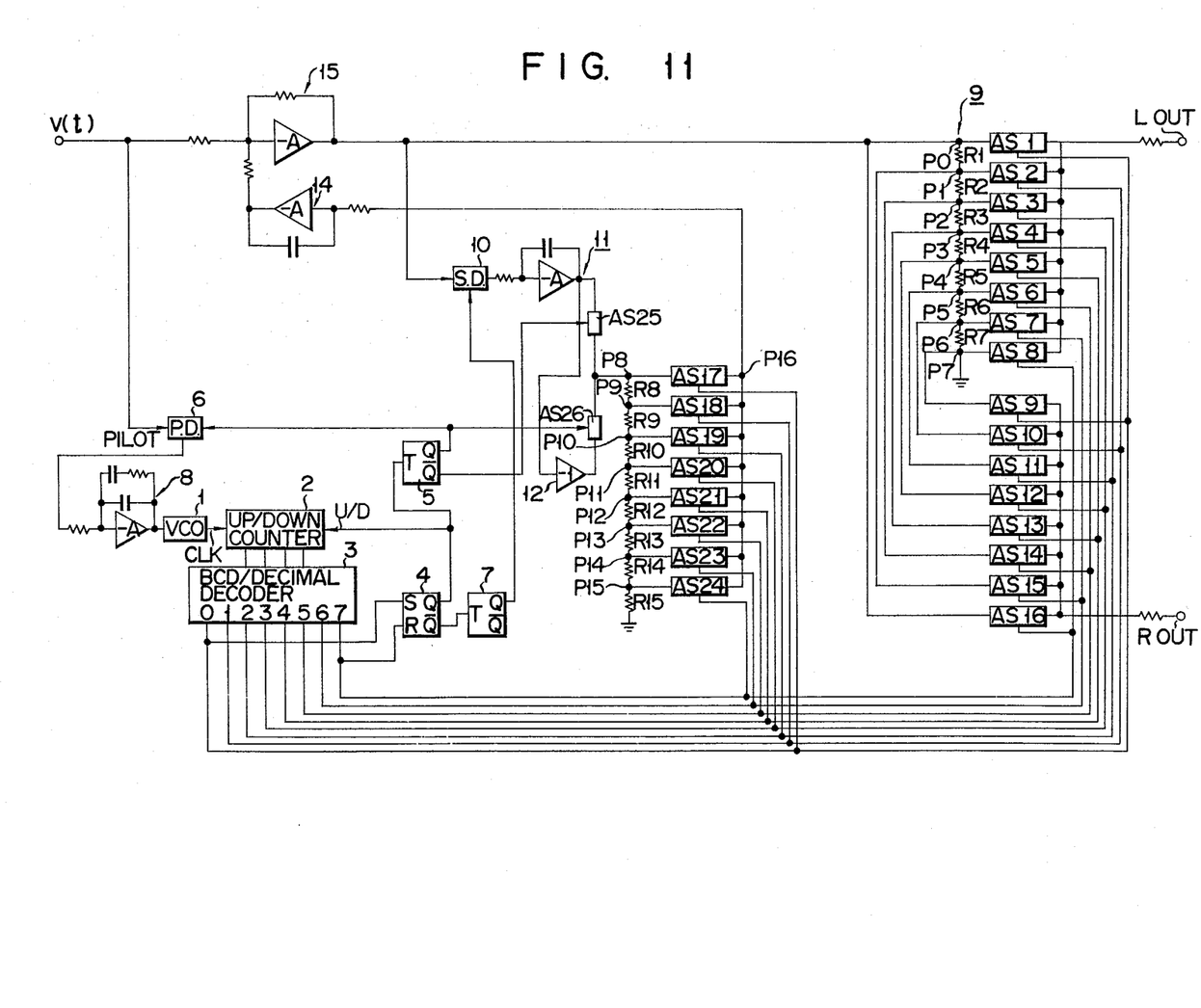

FIG. 11 shows still another embodiment of the FM stereo demodulation circuit of the present invention. The same reference numerals are used in FIG. 11 to denote the same parts as those in FIG. 10, and the description thereof will be excluded. According to this embodiment, the input of synchronous detector 10 is connected to the output of adder 15. As a result, the amplitude level of the cancel signal is controlled in proportion to the amplitude level of the pilot signal component remaining in the output signal of adder 15. Namely, the cancellation of the pilot signal in the composite signal is more effectively achieved.

What is claimed is:
1. An FM stereo demodulation circuit comprising:
   a voltage dividing network connected to receive an FM stereo composite signal which contains a pilot signal of half the frequency of a subcarrier, said voltage dividing network having plurality of outputs which provide a plurality of different voltage levels;
   a first switch circuit having a plurality of analog switches for respectively coupling said outputs of said voltage dividing network to a first output terminal;
   a second switch circuit having a plurality of analog switches for respectively coupling said outputs of said voltage dividing network to a second output terminal; and
   analog switch control circuit means responsive to the pilot signal for scanning said analog switches of said first and second switch circuits such that said analog switches of each of said first and second switch circuits are sequentially enabled in a reciprocating manner over one cycle period of said subcarrier and a switch scan cycle of said first switch circuit is 180° out of phase with that of said second switch circuit.

2. An FM stereo demodulation circuit comprising:
   pilot signal eliminating circuit means for eliminating a pilot signal from an FM stereo composite signal which has the pilot signal of half a frequency of a subcarrier;
   a voltage dividing network connected to receive an output signal of said pilot signal eliminating circuit means, said voltage dividing network having a plurality of outputs which provide a plurality of different voltage levels;
   a first switch circuit having a plurality of analog switches for respectively coupling said outputs of said voltage dividing network to a first output terminal;

a second switch circuit having a plurality of analog switches for respectively coupling said outputs of said voltage dividing network to a second output terminal; and analog switch control circuit means responsive to the pilot signal for scanning said analog switches of said first and second switch circuit such that said analog switches of each of said first and second switch circuits are sequentially enabled in a reciprocating manner over one cycle period of said subcarrier and a switch scan cycle of said first switch circuit is 180° out of phase with that of said second switch circuit.

3. An FM stereo demodulation circuit according to claim 1 or 2, wherein said voltage dividing network is a resistor voltage dividing circuit having a plurality of resistors of an equal resistance value.

4. An FM stereo demodulation circuit according to claim 1 or 2, wherein said voltage dividing network is a resistor voltage dividing circuit having a plurality of resistors which have resistance values symmetrical with respect to a resistor which is located at a center of said plurality of resistors.

5. An FM stereo demodulation circuit according to claim 1 or 2, wherein said analog switch control circuit means comprises a voltage-controlled oscillator for producing a first clock signal having a frequency which is an integral multiple of the subcarrier frequency; and up-down counter having an up-down control input for counting the first clock signal produced by said voltage-controlled oscillator, said up-down counter providing an output in the form of a binary-coded decimal (BCD) code; a BCD/decimal decoder having outputs coupled to said analog switches of each of said first and second switch circuits for decoding a binary-coded decimal code output of said up-down counter; means for generating a second clock signal having the same frequency as the subcarrier frequency in response to outputs of said BCD/decimal decoder, the second clock signal being applied to said up-down control input of said up-down counter; means for producing a third clock signal having the same frequency as the pilot signal by frequency-dividing the second clock signal; and a phase comparator for comparing in phase the third clock signal with the pilot signal in the FM stereo composite signal to control an oscillation frequency of said voltage-controlled oscillator.

* * * * *